United States Patent [19]
Collins et al.

[11] 4,415,987
[45] Nov. 15, 1983

[54] MAGNETIC BUBBLE PASSIVE REPLICATOR

[75] Inventors: Thomas W. Collins, Saratoga; Lung-jo Tao, Cupertino, both of Calif.

[73] Assignee: International Business Machines Corporation, Armonk, N.Y.

[21] Appl. No.: 135,816

[22] Filed: Mar. 31, 1980

[51] Int. Cl.³ .............................................. G11C 19/08
[52] U.S. Cl. ..................................................... 365/12
[58] Field of Search .......................................... 365/12

[56] References Cited
U.S. PATENT DOCUMENTS
3,713,118 1/1973 Danylchuk .......................... 365/12

FOREIGN PATENT DOCUMENTS
54-4030 1/1979 Japan ...................................... 365/12

Primary Examiner—James W. Moffitt
Attorney, Agent, or Firm—Joseph E. Kieninger

[57] ABSTRACT

A passive replicator for bubble devices receives a bubble from an input channel and splits that bubble into two bubbles which go into two separate output channels when a rotating magnetic field is applied. The bubble replicator is a single element which has at least three peripheral areas in spaced relation that are associated with different propagation channels. In preferred embodiments, an elongated bar is present in the propagation channels and it is positioned adjacent to and in spaced relation with a peripheral area of the replicator.

7 Claims, 3 Drawing Figures

MAGNETIC BUBBLE PASSIVE REPLICATOR

DESCRIPTION

1. Technical Field

This invention relates to a magnetic bubble domain devices, and more particularly to a device for replicating bubble domains in a passive manner.

It is a primary object of this invention to provide an improved passive bubble replicator.

It is another object of this invention to provide a passive replicator having improved margins.

It is still another object of this invention to provide a passive replicator that will replicate a bubble into two or more bubbles.

2. Background Art

There are two principal methods of bubble replication. The most widely used replication schemes involve the use of a pulse conductor loop with a permalloy pattern to split a bubble in two. In these current assisted bubble splitters, the bubble is elongated and then severed into two bubbles by applying a current control pulse to provide a repulsive magnetic force to the middle of the elongated bubble. It is desirable, however, to avoid using conductor loops on field access bubble chips because they entail more difficult fabrication techniques as well as requiring the use of current.

The other type of field access bubble replicator which uses permalloy patterns only and does not require a current control pulse is called a passive bubble replicator. One of the first passive bubble replicators is described in U.S. Pat. No. 3,713,118 to Danylchuk which describes a modification of a field access bubble generator employing a revolving seed domain. The Danylchuk replicator requires four separate magnetically soft overlay elements including a square shaped element having a mouth portion, a circular element, an L-shaped element and an elongated bar. Danylchuk also requires a resident bubble domain circulating around the circular element in order to help cut the bubble domain during the replication process. Another passive replicator patent utilizing chevron elements is described in U.S. Pat. No. 3,868,661 to Bonyhard, et al. Other passive replicators utilizing chevron elements are described in U.S. Pat. No. 3,922,652 to Sandfort, et al; U.S. Pat. No. 4,056,813 to Oeffinger et al; and U.S. Pat. No. 4,067,003 to George et al. A passive replicator using T & I bar elements in combination with bubble stretching means is described in U.S. Pat. No. 3,727,197 to Chang. In general, passive replicators have a low operating margin and are inconvenient to use because they require a large area of the bubble chip. Prior art passive replicators have more than one element which in turn requires a large chip area.

BRIEF DESCRIPTION OF THE DRAWINGS

In the accompanying drawings forming a material part of this disclosure.

DISCLOSURE OF THE INVENTION

For a further understanding of the invention and of the objects and advantages thereof, reference will be made to the following description and accompanying drawings, and to the appended claims in which the various novel features of the invention are more particularly set forth.

A passive replicator for bubble devices receives a bubble from an input channel and splits that bubble into two bubbles which go into two separate output channels when a rotating magnetic field is applied. The bubble replicator is a single element of a magnetizable material and has at least three peripheral areas in spaced relation that are associated with different propagation channels. The first area is an input leg portion that is associated with the incoming bubble propagation channel. A second peripheral area of the replicator is associated with a second propagation channel. The bubble splits into two bubbles at the second area with one of the split bubbles passing into the second propagation channel and the other split bubble moving to the third peripheral area which is an output leg portion where the bubble passes into an output channel. In preferred embodiments, an elongated bar is present in the propagation channels and it is positioned adjacent to and in spaced relation to a peripheral area of the replicator.

BEST MODE FOR CARRYING OUT THE INVENTION

Figure 1:
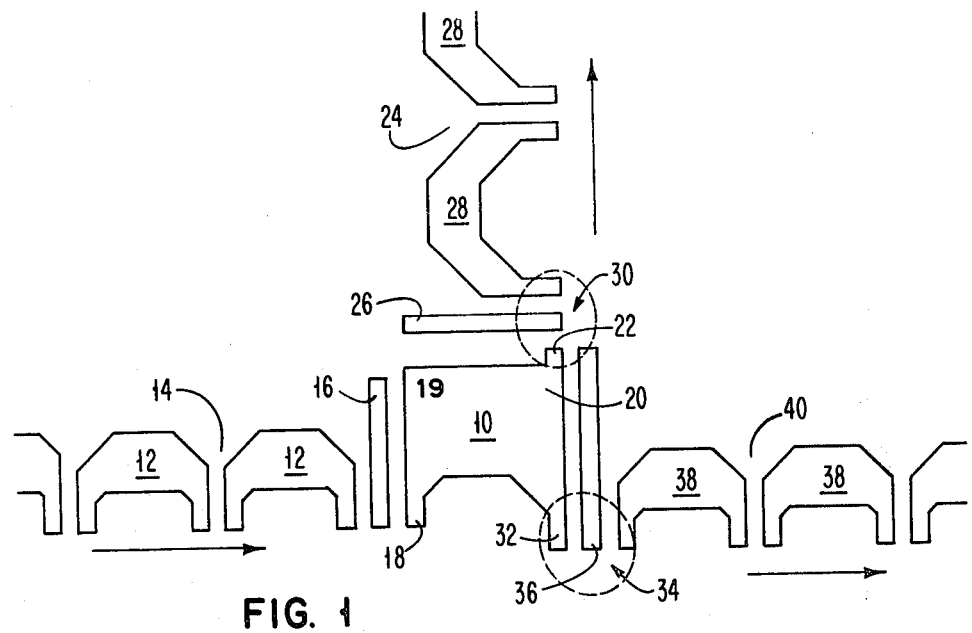
FIG. 1 is a top view illustrating the passive replicator.

The magnetic bubble replicator 10 in accordance with this invention is made of a magnetizable material and is shown in FIG. 1. A data pattern of bubbles is propagated along C-bar elements 12 in the propagation channel 14 upon the application of a rotating magnetic in-plane field. Positioned in channel 14 is an elongated bar 16 which is in spaced relation with the input leg portion 18 of replicator 10. The bubble moves from the input leg portion 18 through the peripheral area 19 to the second peripheral area 20 of replicator 10. The bubble goes directly from area 18 through area 19 to area 20 without splitting because there is no magnetic pole which competes with the magnetic pole of the replicator 10. The elongated bar 16 confines the bubble in replicator 10 so that it doesn't stripe out when the bubble moves from portion 18 to area 20. Preferably the peripheral area 20 has a tab 22 that protrudes into the channel 24. In the channel 24 is an elongated bar 26 that is adjacent to and in spaced relationship to the area 20. The bar 26 also helps to confine the bubble in replicator 10 so that it doesn't stripe out. C-bars 28 are positioned in the channel 24 next to bar 26. The bubble passes from the area 20 into the area 30. As the magnetic in-plane field is rotated the bubble at area 30 is split into two bubbles, the first bubble proceeding along C-bars 28 in channel 24 in the direction shown by the arrow. The bubble is split at this time because the first C-bar element 28 has a magnetic pole which competes with the magnetic pole of replicator 10. The other portion of the bubble that is split in area 30 proceeds along the side of the replicator to output leg portion 32. The bubble moves to area 34 which includes elongated bar 36 and the leg portion of C-bar 38 in channel 40. The bar 36 helps to confine the bubble so it doesn't stripe out while it moves from area 20 to output portion 32. The bubble then moves along C-bars 38 in channel 40 in the direction shown. The direction of the output channel 40 in this embodiment is perpendicular to the propagation direction of channel 24.

The elongated bars 16, 26 and 34 are not required to effect the bubble replication. However, the use of bars 16, 26 and 34 increase the operating margin of the replicator 10 and, as a result, their use is preferred.

Figure 2:
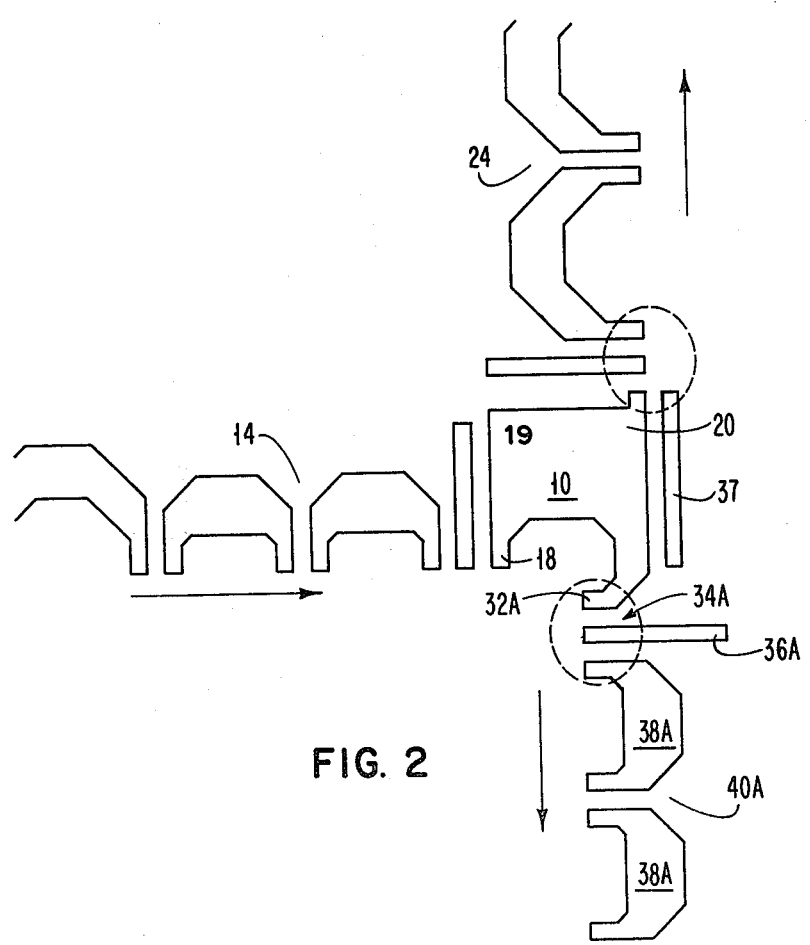
FIG. 2 is a top view illustrating a second embodiment of the passive replicator.

Another embodiment is shown in FIG. 2 in which the elements in input channel 14 and in the propagation channel 24 are positioned in the same relationship to input leg 18 and the peripheral area 20 of replicator 10 in the same manner as described in FIG. 1. The output leg portion 32A of replicator 10 in this embodiment points in a direction towards input channel 14. The same elongated bar 36A and C-bars 38A are in channel 40A and channel 40A is pointed in a direction that is 180° from the direction of channel 24. The variation of the design shown in FIG. 2 enables the bubble pattern and the replicated image to be propagated into the desired directions. In this embodiment, another elongated bar 37 is required to confine the bubble so that it does not stripe out as it moves from peripheral area 20 to the output leg portion 32A.

Figure 3:
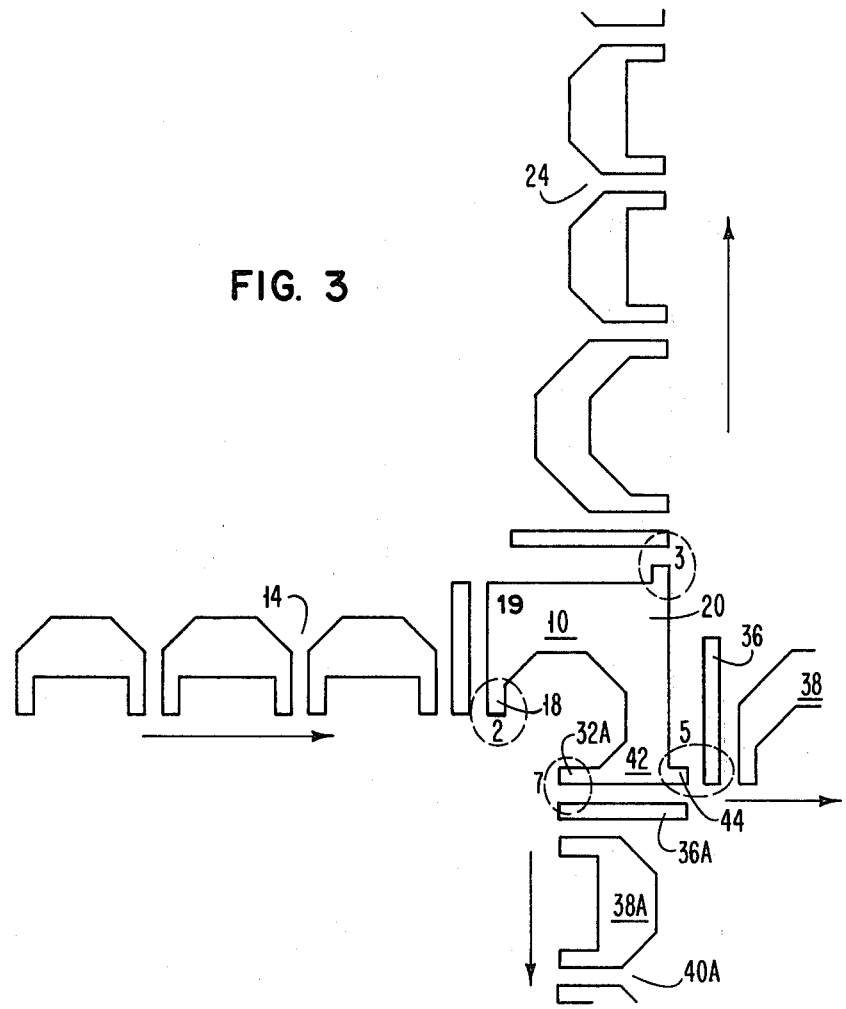
FIG. 3 is a top view illustrating a third embodiment of the passive replicator.

Another embodiment is shown in FIG. 3 in which the replicator 10 has been modified so that it will replicate a bubble twice to become a bubble triplicator. Replicator 10 has the incoming leg portion 18 close to channel 14 and a second peripheral area 20 close to channel 24 as described in FIGS. 1 and 2. Similarly, this embodiment has an output leg portion 32A for propagating bubbles into channel 40A in the same manner as described in FIG. 2. This embodiment has a fourth peripheral area 42 that is in spaced relation with the output leg portion 32A and the replicating area 20. Peripheral area 42 has a tab portion 44 protruding into the channel 40 which contains an elongated bar 36 and C-bars 38 as described in FIG. 1. The bubble triplicator described in FIG. 3 will triplicate the bubble data pattern on the element 10 within one cycle of the rotating magnetic in-plane field.

INDUSTRIAL APPLICABILITY

The primary advantage of a passive replicator design in accordance with this invention is to improve the operating margins normally associated with passive replicators. A passive replicator of the type shown in FIG. 1 exhibited an operating margin of over 30 Oe at 250 KHz with a drive field of 50 Oe.

Passive replicators made in accordance with this invention are useful in applications where replicators are needed in bubble devices. For example, they may be used in particular major/minor loop memory storage devices.

While I have illustrated and described the preferred embodiment of my invention, it is understood that I do not limit myself to the precise constructions herein disclosed and the right is reserved to all changes and modifications coming within the scope of the invention as defined in the appended claims.

We claim:

1. A passive magnetic bubble replicator for use with first, second and third propagation channels comprising:
    a replicator element of a magnetizable material having first, second, third and fourth peripheral corner areas in spaced relation, said first corner area being an input leg portion associated with said first propagation channel, said second corner area for bubble replication associated with said second propagation channel, said third corner area being an output leg portion associated with said third propagation channel, said second corner area separated from said first corner area along the periphery in one direction by said fourth corner area, wherein upon the application of a rotating in-plane magnetic field a first bubble passes from said first propagation channel to said first corner area and then through said fourth corner area to said second corner area where the first bubble is split into second and third bubbles, and said second bubble passing into said second propagation channel, said third bubble passing to said third corner area and then into said third propagation channel.

2. A replicator as described in claim 1 including a tab portion attached to said second corner area and protruding into said second channel wherein said second bubble passes from said second corner area over said tab portion into said second channel.

3. A replicator as described in claim 1 including an elongated bar of a magnetizable material in said second propagation channel positioned adjacent to and in spaced relation with said second area.

4. A replicator as described in claim 3 including a second elongated bar of a magnetizable material positioned adjacent to and in spaced relation with said second area and orthogonal to said first elongated bar.

5. A replicator as described in claim 1 including first, second and third elongated bars of a magnetizable material in said first, second and third propagation channels positioned adjacent to and in spaced relation with said first, second and third areas respectively.

6. A passive magnetic bubble replicator for use with first, second, third and fourth propagation channels comprising:
    a replicator element of a magnetizable material having first, second, third, fourth and fifth peripheral areas in spaced relation, said first area being an input leg portion associated with said first channel, said second area for bubble replication associated with said second channel, said third area for bubble replication associated with said third channel, said second area separated from said first area along the periphery in one direction by said fourth area, said fifth area being an output leg portion associated with said fourth channel wherein upon application of a rotating in-plane magnetic field a first bubble passes from said first channel to said first area input leg portion and then through said fourth area to said second area area where the first bubble is split into second and third bubbles, said second bubble passing into said second propagation channel, said third bubble passing to said third area where it is split into fourth and fifth bubbles, said fourth bubble passing into said third channel, said fifth bubble passing into said fifth area output leg portion and then into said fourth channel.

7. A replicator as described in claim 6 including an elongated bar of a magnetizable material in each of said channels adjacent to and in spaced relation with said first, second, third and fifth areas respectively.

* * * * *